United States Patent [19]

Drach et al.

[11] Patent Number: 5,487,014

[45] Date of Patent: Jan. 23, 1996

[54] LOW COST AUTOMATED SYSTEM FOR EVALUATING THE ELECTRICAL CHARACTERISTICS OF FERROELECTRIC MATERIALS

[75] Inventors: William C. Drach, Tinton Falls; Richard W. Babbitt, Fair Haven; Thomas E. Koscica, Clark, all of N.J.

[73] Assignee: The United States of America as represented by the Secretary of the Army, Washington, D.C.

[21] Appl. No.: 296,824

[22] Filed: Aug. 26, 1994

[51] Int. Cl.$^6$ .................................................. G01R 1/00
[52] U.S. Cl. .............................................. 364/481; 422/62
[58] Field of Search ................................ 364/481–483, 364/557, 496–499, 500; 422/62, 109, 112, 131; 324/658, 663, 600, 649

[56] References Cited

U.S. PATENT DOCUMENTS 3,774,237  11/1973  Hardway, Jr. ............................ 324/663
3,793,717  2/1974  Desenkolb et al. ...................... 364/552
4,399,100  8/1983  Zsolnay et al. ........................... 422/62

Primary Examiner—James P. Trammell
Attorney, Agent, or Firm—Michael Zelenka; James A. DiGiorgio

[57] ABSTRACT

A system that provides an automated simultaneous measurement of the electrical characteristics of a ferromagnetic material as a function of temperature and electric potential. The system utilizes a personal computer that interfaces with a DUT fixture through an interface measuring circuit that provides a means for remote control of the measurement process and insures a more timely and less manually intensive measuring process. The interface measuring circuit is composed of a temperature measuring circuit for measuring the temperature applied to the DUT, a capacitor measuring circuit for measuring the electric potential applied to the DUT, a high voltage power supply, a temperature plate power supply, a high voltage power supply driver, a digital voltage meter (DVM), and a DVM multiplexer. The system can utilize a humidity-free "dry" chamber (i.e. a desiccation chamber) to insure that the measurements of the DUT are reliable and accurate.

4 Claims, 1 Drawing Sheet

LOW COST AUTOMATED SYSTEM FOR EVALUATING THE ELECTRICAL CHARACTERISTICS OF FERROELECTRIC MATERIALS

GOVERNMENT INTEREST

The invention described herein may be manufactured, used, and licensed by or for the government of the United States of America for governmental services without the payment to us of any royalty thereon.

NOTICE OF RELATED INVENTION

The invention described herein is related to the applicants' co-pending application, Ser. No. 08/296,825 entitled "QUICK-MOUNT MEASURING DEVICE FOR EVALUATING THE ELECTRICAL CHARACTERISTICS OF FERROELECTRIC MATERIALS, " filed Aug. 26, 1994 and incorporated herein by reference.

FIELD OF THE INVENTION

This invention relates to the field of measuring electrical characteristics of ferroelectric materials, and more specifically to an automated system for measuring the electrical characteristics of a ferroelectric material, such as its dielectric constant versus temperature and its dielectric constant versus electric potential.

BACKGROUND OF THE INVENTION

Heretofore, measuring the electrical characteristics of a ferroelectric material, such as its dielectric constant versus temperature (Currie Point test) or its dielectric constant versus electric potential, has required a very manually intensive data taking procedure. Basically, the prior art devices used for taking such measurements comprised a temperature controlled plate, a receptacle for placing or holding the ferroelectric material or device under test (DUT) on the temperature plate, and a manual means for taking the actual physical measurements of the DUT's electrical characteristics. In order to measure both the dielectric constant versus electric potential and the dielectric constant versus temperature with such devices, the artisan would have to perform two separate tests. Thus, the prior art system for obtaining such material characterizations was time consuming, costly and difficult to administer.

As a result, those skilled in the art would greatly welcome any system that could provide the simultaneous measurement of a ferroelectric material's dielectric constant as a function of temperature and electric potential in a more timely, and less manually intensive manner.

SUMMARY OF THE INVENTION

Accordingly, the present invention provides an automated system for the simultaneous measurement of the dielectric constant of a ferroelectric material over a predetermined range of temperature and a predetermined range of electric potential. To attain this, the present invention provides a quick-mount DUT fixture which houses the DUT, and a computer controlled measuring circuit that automatically controls the electric potential and the temperature applied to the DUT and automatically measures the DUT's electrical characteristics.

More specifically, The fixture provides easy placement of the DUT onto a temperature plate which can be placed in a humidity free chamber (i.e. desiccation chamber) without compromising the intimate thermal contact between the DUT and the temperature or electric control. This insures that the DUT can be tested in a dry (low humidity) environment, and thus insures highly reliable measurements. (See, inventor's copending patent application entitled "QUICK-MOUNT MEASURING DEVICE FOR EVALUATING THE ELECTRICAL CHARACTERISTICS OF FERROELECTRIC MATERIALS," Ser. No. 08/296,825, filed Aug. 26, 1994, U.S. Pat. No. 5,451,866 and incorporated herein by reference, which states that the higher the humidity on the DUT at the time of the test, the lower the reliability of the measurement of its electrical characteristics. A computer controlled measuring circuit interfaces between a computer which runs the measurement process and the DUT.

In a preferred embodiment of the invention, the computer controlled measuring circuit is composed of: (1) a temperature measuring circuit for measuring the temperature applied to the DUT, (2) a capacitor measuring circuit for measuring the electric potential applied to the DUT, (3) a high voltage power supply, (4) a temperature plate power supply, (5) a high voltage power supply driver, (6) a digital voltage meter (DVM), and (7) a DVM multiplexer. As a result, the computer can automatically run the simultaneous testing of the DUT's dielectric constant over a predetermined temperature range and a predetermined electric potential range. Consequently, the present invention overcomes, to a large extent, the problems that have beset the measuring devices of the prior art.

These and other features of the invention are described in more complete detail in the following description of the preferred embodiment when taken with the drawings. The scope of the invention, however, is limited only by the claims appended hereto.

DETAILED DESCRIPTION OF THE INVENTION

Figure 1:
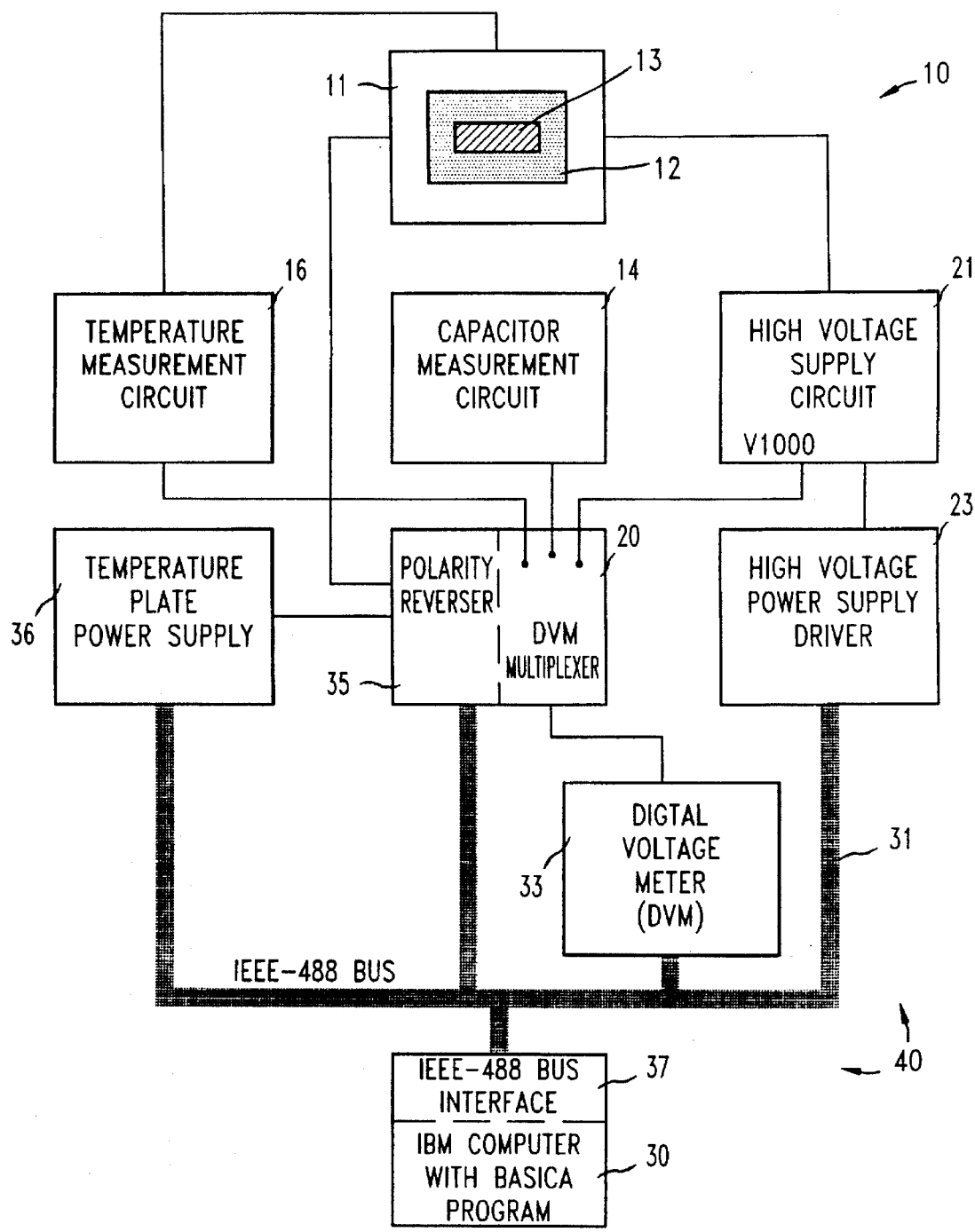
FIG. 1 is a block diagram view of a preferred embodiment of the invention.

Referring now to FIG. 1, there is shown a block diagram of a preferred embodiment 10 of the invention. Embodiment 10 is composed of a DUT fixture 11 having a temperature plate 12 upon which a DUT 13 can be placed for temperature measurements. Temperature plate 12 can be placed in a dry or humidity-free chamber (not shown) to insure the accuracy of the subject measurements.

A computer controlled measuring circuit 40 composed of temperature measurement circuit 16, capacitor measuring circuit 14, DVM multiplexer 20, high voltage power supply 21, high voltage power supply driver 23, digital voltage meter 33, polarity reverser 35 and temperature plate power supply 36, and a personal computer or computer 30 having an IEEE-488 Bus Interface 37 that communicates over an IEEE-488 Bus 31. More specifically, temperature measurement circuit 16 electrically connects and interfaces DVM multiplexer 20 with a temperature sensor (not shown) mounted within temperature plate 12. Capacitor measurement circuit 14 electrically connects and interfaces DUT 13 with DVM multiplexer 20. High voltage supply 21 electrically connects and interfaces DUT 13 with DVM multiplexer 20 and High voltage power supply driver 23. High voltage power supply driver 23 is electrically connected to computer 30 through IEEE-488 Bus 31.

DVM multiplexer 20 is electrically connected to digital volt meter 33 which, in turn, is electrically connected to computer 30 through IEEE-488 Bus 31. Polarity reverser 35 is electrically connected to temperature plate 12 and temperature plate power supply 36. Both temperature plate power supply 36 and polarity reverser 35 are electrically connected to computer 30 through IEEE-488 Bus 31.

IEEE-488 interface 37 allows computer 30 to control and monitor DUT 13's electrical characteristics through IEEE-488 Bus 31. In addition, DVM multiplexer 20 allows computer 30 to switch digital voltmeter 33 between temperature measurement circuit 16, capacitor measurement circuit 14, and high voltage supply 21. As a result, computer 30 can establish a feedback loop between temperature measurement circuit 16 and temperature plate power supply 36 such that precision computer control of DUT 13's temperature can be maintained.

In operation, DUT 13 is placed on temperature plate 12 in a humidity-free "dry" chamber (not shown). Computer 30 then runs a preprogrammed procedure to systematically measure the electrical characteristics of DUT 13 as a function of temperature and electric potential. More specifically, computer 30 runs the following procedure:

1. Initialize software and hardware.
2. Input DUT 30's dimensions, calibration data, predetermined voltage (electrical potential) range, voltage step size, temperature range, and temperature step size.
3. Adjust temperature plate to lowest temperature in the predetermined temperature range.
4. At that temperature, vary the voltage applied to DUT 30 over the specified voltage range and record the electrical characteristics (i.e. dielectric constant) of DUT 30 for each voltage increment.
5. If the temperature is not at the maximum temperature within the predetermined temperature range to be tested, then increment the temperature by the predetermined temperature increment and repeat step 4.
6. If the temperature is the maximum temperature of the predetermined range, then record and report the electrical characteristics of DUT 13.

This procedure combines the measurement of the electrical characteristics (i.e. dielectric constant) of DUT 30 as a function of temperature and electric potential into one unsupervised test. As a result, the present invention overcomes, to a large extent, the problems that have beset the measuring devices of the prior art.

What is claimed is:

1. A low-cost automated system for measuring the electrical characteristics of a ferroelectric material, comprising:

a fixture having a temperature plate upon which the ferroelectric material is placed, said temperature plate having a temperature sensor positioned thereon directly beneath the ferroelectric material;

a computer controlled measuring circuit electrically connected to the ferroelectric material and said fixture for applying a predetermined range of temperature and electric potential to said ferroelectric material, and for automatic and simultaneous measurement of the electrical characteristics of the ferroelectric material at each said predetermined temperature and electrical potential;

said computer controlled measuring circuit having a computer with a IEEE-488 Interface, an IEEE-488 Bus electrically coupled to said IEEE-488 Interface, a temperature plate power supply electrically coupled to said computer through said IEEE-488 Bus, a digital voltmeter electrically coupled to said computer through said IEEE-488 Bus, a high voltage power supply driver electrically coupled to said computer through said IEEE-488 Bus, a multiplexor and a polarity reverser electrically coupled to said computer through said IEEE-488 Bus, a temperature measuring circuit electrically coupled to said multiplexer and said fixture, a capacitor measuring circuit electrically coupled to said multiplexer and said fixture, a high voltage power supply electrical coupled to said high voltage power supply driver, said multiplexer and said fixture, said polarity reverser electrically connected to said temperature plate, said power supply and said fixture.

2. The system of claim 1 wherein said computer measures said electrical characteristics of said ferroelectric material in a predetermined procedure, said predetermined procedure comprising the steps of:

a. Initializing the software and hardware of said computer.
   b. Inputing the dimension of said ferroelectric material, calibration data, a predetermined voltage (electrical potential) range, a predetermined voltage step size, a predetermined temperature range, and predetermined temperature step size.
   c. Adjusting said temperature plate to the lowest temperature in said predetermined temperature range.
   d. Applying said electric potential to said ferroelectric material over the entire predetermined voltage range at increments equal to said predetermined voltage step size and recording said electrical characteristics of said ferroelectric material for said predetermined voltage increment.
   e. Incrementing the temperature applied to said temperature plate by said predetermined temperature step size if said temperature is not at the maximum temperature within said predetermined temperature range and repeating step d.

3. The system of claim 2 wherein said predetermined temperature range is −30 to 100 degrees Celsius.

4. The system of claim 1 wherein said fixture is placed in a humidity free chamber to insure that said measurements of said electrical characteristics of said ferroelectric material are accurate and reliable.

* * * * *